United States Patent [19]

Takamasa

[11] 4,359,653
[45] Nov. 16, 1982

[54] INTEGRATED CIRCUIT HAVING A PLURALITY OF CURRENT MODE LOGIC GATES

[75] Inventor: Suzuki Takamasa, Tokyo, Japan

[73] Assignee: Nippon Electric Co., Ltd., Tokyo, Japan

[21] Appl. No.: 163,891

[22] Filed: Jun. 27, 1980

[30] Foreign Application Priority Data

Jun. 28, 1979 [JP] Japan .................................. 54-81902

[51] Int. Cl.³ ................. H03K 19/087; H03K 19/092; H03K 19/003
[52] U.S. Cl. .................................... 307/455; 307/297; 307/443; 307/475
[58] Field of Search ............... 307/297, 362, 363, 443, 307/446, 455, 467, 364, 203, 215, 218, 475

[56] References Cited

U.S. PATENT DOCUMENTS

| | | | |
|---|---|---|---|
| 3,508,076 | 4/1970 | Winder | 307/455 X |
| 3,539,824 | 11/1970 | Yu et al. | 307/455 |
| 3,577,073 | 5/1971 | Cray | 307/455 X |
| 3,622,799 | 11/1971 | Marley | 307/455 |
| 3,648,064 | 3/1972 | Mukai et al. | 307/455 |
| 3,679,917 | 7/1972 | Bryant et al. | 307/310 X |
| 3,686,512 | 8/1972 | Kroos | 307/455 |
| 3,716,722 | 2/1973 | Bryant et al. | 307/455 X |

Primary Examiner—Larry N. Anagnos
Attorney, Agent, or Firm—Sughrue, Mion, Zinn, Macpeak & Seas

[57] ABSTRACT

An integrated circuit employing a plurality of current mode logic gates operable with a low power consumption and at a high speed is disclosed. The integrated circuit comprises a terminal for receiving a reference signal from the outside, an input stage current mode logic gate supplied with an input signal from the outside and the reference signal, an internal reference voltage generator circuit for generating an internal reference voltage having an intermediate value of binary logic levels of the output signals of the input stage current mode logic gate, and an internal stage current mode logic gate supplied with the output signal from the input stage logic gate and the internal reference voltage.

14 Claims, 9 Drawing Figures

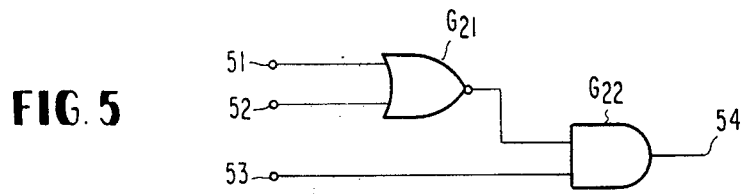

INTEGRATED CIRCUIT HAVING A PLURALITY OF CURRENT MODE LOGIC GATES

The present invention relates to an integrated circuit and, more particularly, to one including current mode logic circuits.

A current mode logic circuit (hereinafter abbreviated as "CML") is widely used as a logic gate which can operate at a high speed.

CML is basically composed of two transistors, wherein the emitters of both transistors are commonly connected to a current source and a base of one of the transistors is supplied with an input signal and a base of the other transistors is supplied with a reference voltage. The reference voltage is generally set substantially at an intermediate value of the amplitude of the input signal. This value of the reference voltage corresponds to a logic threshold value and has a significant meaning.

In an integrated circuit having a plurality of such CMLs, there has been practiced a method in which a reference voltage is supplied from the outside of the integrated circuit commonly to all the CMLs. In another method, a constant voltage circuit is provided in the integrated circuit to provide a reference voltage commonly for all the CMLs.

In the method for supplying the reference voltage from the outside commonly to the CMLs, however, the reference voltage cannot be set at a center value for the amplitude of the input signal for all the CMLs. This tendency is emphasized by the fluctuations in the manufacturing condition, temperature and supply voltage of the integrated circuit. Thus, there arises with the external reference voltage the drawback that noise margins are deteriorated.

On the other hand, in case reference voltage generated by the constant voltage circuit within the integrated circuit is used, various fluctuations can be offset for the signals in the integrated circuit. In the CML supplied with a signal from the outside, however, the logic threshold value of the CML appears to be shifted to one power source side with respect to the signal from the outside by the fluctuations in the power source, temperature and the like. This results in the drawback that the reference voltage is shifted from that intermediate value with respect to the external signal so that, again, the noise margins are reduced.

It is therefore an object of the present invention to provide an integrated circuit which is equipped with a plurality of CMLs operable with high noise margins.

Another object of the present invention is to provide a current switch logic type integrated circuit which can operate at a high speed with a low power consumption.

According to the present invention, there is provided an integrated circuit including a plurality of current mode logic circuits, characterized in that a reference voltage supplied from the outside is used in the logic circuit at an input stage for receiving an external signal and a reference voltage generated in the integrated circuit is supplied to the remaining logic circuits.

According to the present invention, there is provided an integrated circuit comprising an input terminal, an output terminal, a reference voltage terminal for receiving a reference voltage, a first current mode logic circuit including an input point and a reference point, a second current mode logic circuit including an input point receiving a signal generated in the integrated circuit and a reference point, an internal reference voltage generator circuit for generating an internal reference voltage, first means for connecting the reference voltage terminal to the reference point of the first current mode logic circuit, second means for supplying the internal reference voltage generated by the internal reference voltage generator to the reference point of the second current mode logic circuit, and output means for supplying the output signal of the second current mode logic circuit to the output terminal.

BRIEF DESCRIPTION OF THE DRAWINGS

FIG. 5 is a block diagram showing an example of a logic circuit;

FIG. 6 is a circuit diagram showing a second embodiment of the present invention, in which the logic circuit of FIG. 5 is realized;

FIGS. 7 and 8 are circuit diagrams showing examples of the constant current source; and FIG. 9 is a circuit diagram showing one example of the internal reference voltage generator circuit;

DESCRIPTION OF THE PREFERRED EMBODIMENTS

Figure 1:
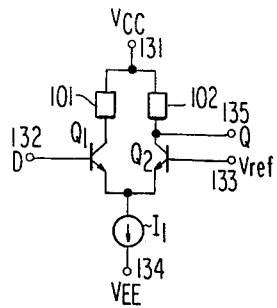
FIG. 1 is a circuit diagram showing a conventional CML.

In FIG. 1, a basic CML structure is shown.

Transistors $Q_1$ and $Q_2$ are paired to switch the current of a current source $I_1$ therebetween.

A reference voltage $V_{ref}$ is applied to a base of the transistor $Q_2$ via a terminal 133 so that the switching operation is effected in accordance with the potential difference between the signal voltage to be impressed upon the base (or a terminal 132) of the transistor $Q_1$ through a terminal 132 and the aforementioned reference voltage. Terminals 131 and 134 are connected with voltage sources $V_{CC}$ and $V_{EE}$.

Load elements 101 and 102 may be resistors. The logic amplitude is determined by the voltage drop due to those load elements and the currents flowing therethrough, and the levels of the currents are substantially determined by the current source $I_1$ so that a predetermined logic amplitude appears at the output terminal 135(Q).

Figure 2:
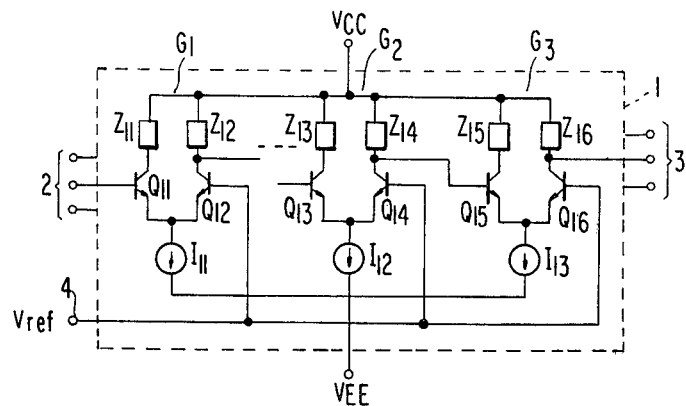
FIG. 2 is a circuit diagram showing a conventional CML type integrated circuit.

With reference to FIG. 2, a prior art CML type integrated circuit employing a reference voltage supplied from the outside will be described.

The integrated circuit 1 includes a plurality of CML type logic gates, some of which are illustrated with references $G_1$ to $G_3$, and is equipped with a group of input terminals 2, a group of output terminals 3 and a reference voltage terminal 4. The CML type gate $G_1$ is an input stage gate and includes load elements $Z_{11}$ and $Z_{12}$, transistors $Q_{11}$ and $Q_{12}$ a constant current source $I_{11}$. The base of the transistor $Q_{11}$ is connected to one of the input terminals 2. The CML type gate $G_2$ includes load elements $Z_{13}$ and $Z_{14}$, transistors $Q_{13}$ and $Q_{14}$ and a constant current source $I_{12}$. The base of the transistor $Q_{13}$ receives an inner signal (not shown) produced within the integrated circuit 1. The CML type gate $G_3$ is an output stage gate and includes load elements $Z_{15}$ and $Z_{16}$, transistors $Q_{15}$ and $Q_{16}$ and a constant current source $I_{13}$. The collector of the transistor $Q_{16}$ is coupled to one of the output terminals 3 so that an output signal is derived therefrom. Bases of the transistors $Q_{12}$, $Q_{14}$ and $Q_{16}$ are commonly supplied with the reference voltage $V_{REF}$ through the terminal 4.

Here, since all the circuits including the input stage gate $G_1$ to the output stage gate $G_3$ are similarly supplied with the reference voltage $V_{ref}$, their logic operations may be accomplished in accordance with the respective differences between the reference voltage $V_{ref}$ and the signal voltages applied to the respective gates. In the CML type integrated circuit, the input signal from the outside and the internal signal generated in the integrated circuit are preferably set to have the same swing amplitude with respect to the same reference voltage. However, the amplitude of the input signal from the outside is generally larger than that of the internal signal produced within the integrated circuit in view of signal transmission and avoiding noise, and hence it is difficult to fulfill the above preference. In consequence, both of center (intermediate) values of the input signal and the inner signal cannot be set at the reference voltage.

Figure 3:
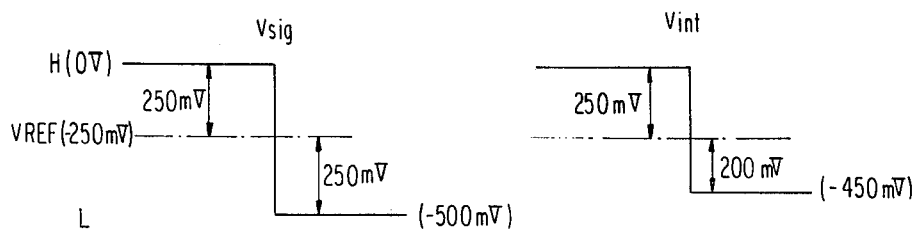
FIG. 3 shows wave forms of an input signal and an internal signal in the conventional CML integrated circuit.

Furthermore, the amplitude of the internal signal is frequently reduced by fluctuations in the manufacturing condition, temperature and power supply voltage. As a result, the difference in the amplitude between the input signal and the internal signal is further enlarged, resulting in loss of noise margin. For example, when the input signal $V_{sig}$ has the logic amplitude of 500 mV which swings between a high level of 0 V and a low level of $-500$ mV, the internal signal $V_{int}$ may have the logic amplitude of 450 mV which swings between a high level of 0 V and a low level of $-450$ mV as shown in FIG. 3. In this case, the reference voltage $V_{REF}$ supplied from the outside of the integrated circuit is set at $-250$ mV corresponding to the center value of the input signal $V_{sig}$. Thus, the noise margin of 250 mV is obtained for the input stage gate receiving the input signal $V_{sig}$ at the both of low and high level sides. However, for the gates receiving the internal signal $V_{int}$, the noise margin becomes 200 mV at the low level side which is insufficient when the power supply voltage or the operating temperature fluctuates.

Furthermore, the response characteristic of the gate receiving the internal signal $V_{int}$ depends on the wave form of the internal signal, due to imbalance of the noise margins between the high level side and the low level side. Therefore, stable and high-speed operation cannot be expected.

Furthermore, if it is attempted to widen the noise margin of the low level side by increasing the amplitude of the internal signal, there arises another drawback that reduction of the power consumption and speed-up of operation are not attained.

On the other hand, if the reference voltage generated inside of the integrated circuit is used commonly in place of the reference voltage $V_{ref}$ supplied from outside, the various fluctuations can be offset for the signal generated in the integrated circuit. However, at the portion for receiving the external signal, the threshold voltage appears to shift to the level of the power supply voltage $V_{CC}$ or $V_{EE}$ as a reslt of fluctuations of the reference voltage generated inside. Consequently, the external signal at one level has its noise margin increased while at the other level its noise margin is decreased, to result in imbalance thereof.

This means that the fluctuation in the reference voltage generated inside the circuit deteriorates the noise margins at the portion receiving the external signal.

Also, the shift in the threshold voltage causes a difference in the time period for the external (input) signal to reach the threshold value in accordance with its waveform (e.g., from high to low level or vice versa).

As a result, there arises the drawback that imbalance causes a time delay for response in accordance with the external signal waveform.

The present invention solves these problems and will now be described in connection with specific embodiments thereof.

Figure 4:
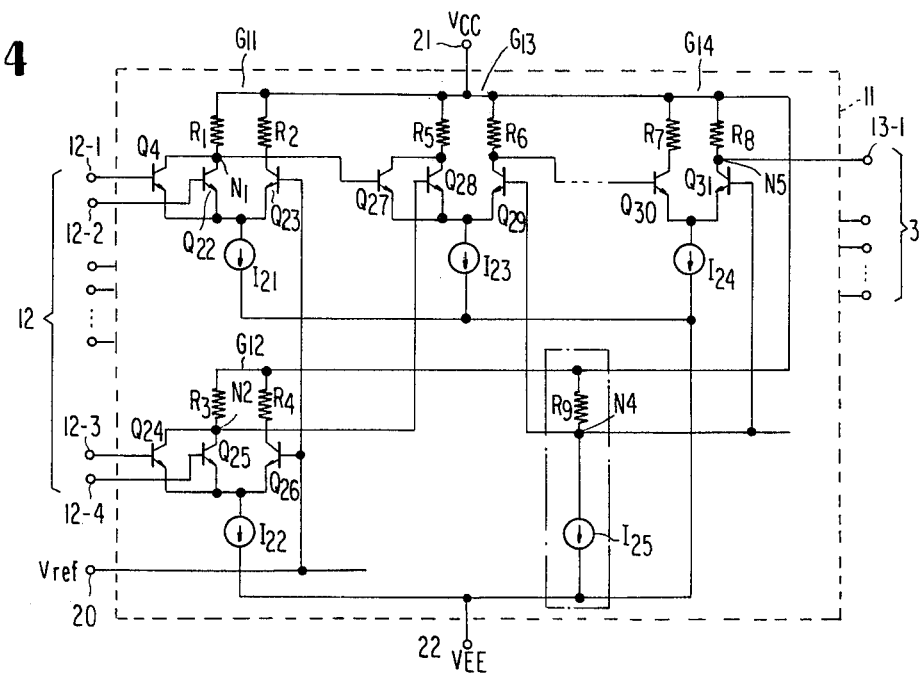
FIG. 4 is a circuit diagram showing a first embodiment of the present invention.

With reference to FIG. 4, a CML type integrated circuit according to a first embodiment of the present invention will be described. This integrated circuit 11 includes an input stage of logic gates $G_{11}$ and $G_{12}$, an intermediate stage of logic gate $G_{13}$ for receiving the internal signals, an output stage of logic gate $G_{14}$ for generating an output signal, a reference voltage generator circuit 14, a group of input terminals 12, a group of output terminals 13, and a reference voltage terminal 20.

The logic gate $G_{11}$ includes a pair of load resistors $R_1$ and $R_2$, three emitters-coupled transistors $Q_{21}$, $Q_{22}$ and $Q_{23}$ and a constant current source $I_{21}$. Bases of the transistors $Q_{21}$ and $Q_{22}$ are coupled to the input terminals 12-1 and 12-2, while a base of the transistor $Q_{23}$ is connected to the reference voltage terminal 20 to form a two-input CML NOR gate. The logic gate $G_{12}$ includes a pair of load resistors $R_3$ and $R_4$, three emitter-coupled transistors $Q_{24}$, $Q_{25}$ and $Q_{26}$ and a constant current source $I_{22}$. Bases of the transistors $Q_{24}$ and $Q_{25}$ are coupled to the input terminals 12-3 and 12-4, while a base of the transistor $Q_{26}$ is coupled to the reference voltage terminal 20 to form another two-input CML NOR gate.

The reference voltage generator circuit 14 is made of a series circuit of a resistor $R_9$ and a constant current source $I_{25}$ inserted between power supply terminals 21 and 22. An internal reference voltage is derived from a junction point $N_4$.

The gate $G_{13}$ operates as a two-input OR gate and includes a pair of load resistors $R_5$ and $R_6$, three emitter-coupled transistors $Q_{27}$, $Q_{28}$ and $Q_{29}$ and a constant current source $I_{23}$. Bases of the transistors $Q_{27}$ and $Q_{28}$ are connected to an output point $N_1$ of the gate $G_{11}$ and an output point $N_2$ of the gate $G_{12}$, respectively. A base of the transistor $Q_{29}$ is connected to the point $N_4$ of the internal reference voltage generator circuit 14.

The gate $G_{14}$ includes a pair of load resistors $R_7$ and $R_8$, a pair or emitter-coupled transistors $Q_{30}$ and $Q_{31}$ and a constant current source $I_{24}$. A base of the transistor $Q_{31}$ is connected to the point $N_4$ and a base of the transistor $Q_{30}$ receives an internally generated signal, i.e. the signal from the point $N_3$. A junction point $N_5$ of the resistor $R_8$ and a collector of the transistor $Q_{31}$ is coupled to the output terminal 13-1.

In this integrated circuit, signal amplitude at the group of input terminals is set to be 500 mV (from 0 V to $-500$ mV), while signal amplitude of the internal signals such as those derived from the point $N_1$, $N_2$ and $N_3$ are to be 380 mV. Then, the reference voltage $V_{REF}$ supplied to the terminal 20 is set at $-250$ mV, while the internal reference voltage derived from the point $N_4$ is set at $-190$ mV.

Thus, the reference voltages can be set at the respective center values of the signal amplitudes to be received in each of the gates.

Thus, the reference voltage supplied from the outside is preset in the vicinity of the center value of the external signal voltage for the external signal, and the reference voltage generated inside is preset in the vicinity of the center value of the internal signal.

For both signals, therefore, the deviation of the manufacturing condition of the integrated circuit and fluctuations in the temperature and in the power supply voltage can be offset so that the reference voltage may be maintained in the vicinity of the center value of the signal voltage all the time for all gates. As a result, in comparison with the conventional case, in which the logic operations are accomplished by a uniform reference voltage supplied from the outside, the desired noise allowances can be retained, even if the amplitude of the internal signal is decreased, so that the power consumption can be lowered.

This means that speed-up can be attained an extent corresponding to the reduction in the amplitude in the internal signal as compared to the same power consumption.

In comparison with the case, moreover, where the logic operations are accomplished at the uniform reference voltage generated inside, it is possible to eliminate both the reduction in the noise margin at the input stage receiving the external signals such as $G_1$ and $G_2$ due to the fluctuations in the internal reference voltage as a result of the various fluctuations and the imbalance in the response or propagation delay time at the input stage gate due to variations in the external input waveform.

Next, with reference to FIGS. 5 and 6, a second preferred embodiment of the present invention will be described.

In this embodiment, an integrated circuit including a NOR gate $G_{21}$ having two inputs connected to input terminals 51 and 52, an AND gate $G_{22}$ having a first input coupled to an input terminal 53 and a second input coupled to an output of the gate $G_{21}$ is shown in FIG. 5. In this case, the gate $G_{22}$ receives both the external signal and the internal signal.

Detailed structure of the circuit shown in FIG. 5 is indicated in FIG. 6.

The NOR gate $G_{21}$ includes a pair of load resistors $R_{41}$ and $R_{42}$, three emitter-coupled transistors $Q_{41}$, $Q_{42}$ and $Q_{43}$ and a constant current souce $I_{31}$. Bases of the transistors $Q_{41}$ and $Q_{42}$ are connected to the input terminals 51 and 52, while a base of the transistor $Q_{43}$ is connected to a reference voltage terminal 60 to which a reference voltage $V_{REF}$ is applied from the outside. A transistor $Q_{44}$ and a resistor $R_{46}$ form a first level shift circuit $L_1$ and shift a level at the input terminal 53. A transistor $Q_{49}$ and a resistor $R_{47}$ form a second level shift circuit $L_2$ for shifting a level of the reference voltage $V_{REF}$.

The gate $G_{22}$ has a longitudinal logic structure which includes a first pair of emitter-coupled transistors $Q_{45}$ and $Q_{46}$, a second pair of emitter-coupled transistors $Q_{47}$ and $Q_{48}$ and a constant current source $I_{32}$. An internal reference voltage generator circuit 74 is made of a serially connected resistor $R_{45}$ and a constant current source $I_{33}$ arranged between a first power supply terminal for receiving a power voltage $V_{CC}$ and a second power supply terminal for receiving a power supply voltage $V_{EE}$. An internal reference voltage is derived from a junction point $N_{10}$. Among the first pair of emitter-coupled transistors $Q_{45}$ and $Q_{46}$, a base of the transistor $Q_{45}$ receives an output signal of the gate $G_{21}$, while a base of the transistor $Q_{46}$ receives the internal reference voltage.

Among the second pair of emitter-coupled transistors $Q_{47}$ and $Q_{48}$, a base of the transistor $Q_{47}$ receives a level shifted input signal through the input terminal 53 and the first level shift circuit $L_1$, and a base of the transistor $Q_{48}$ receives a level shifted reference voltage through the terminal 60 and the second level shift circuit $L_2$.

Even in the case of FIG. 5, the longitudinal logic gate and the level shift circuit, as shown in FIG. 6, are used so that the internal and external signal may be easily received by the reference voltages generated inside and supplied from the outside to effect the logic operations. Thus, the same effects as those of FIG. 4 can be realized.

Although, incidentally, the external signal (including the reference voltage) has its level shifted in FIG. 6, similar effects can be attained even if the internal signal (including the reference voltage) has its level shifted.

With reference to FIGS. 7 and 8, some examples of the constant current source suitable to those $I_{21}$ to $I_{25}$ in FIG. 4 and $I_{31}$ to $I_{33}$ in FIG. 6 will be described.

In FIG. 7, the transistor $Q_{C1}$ and the resistor $R_E$ connected in series between a constant current output terminal $I_{out}$ and the power supply voltage $V_{EE}$ form a constant current path, while a series circuit made of a resistor $R_B$, a transistor $Q_{C2}$ and a zener diode arranged between the power supply voltages $V_{CC}$ and $V_{EE}$ biases a base of the transistor $Q_{C1}$.

In FIG. 8, a series circuit of resistors $R_{81}$ and $R_{82}$ is used to bias the base of the transistor $Q_{C1}$ in place of the series circuit including the resistor $R_B$, the transistor $Q_{C2}$ and the diode $D_1$.

Next, one example of the internal reference voltage generator circuit 14 in FIG. 4 or 74 in FIG. 6 will be indicated in FIG. 9. In this case, as a constant current source ($I_{25}$ in FIG. 4 or $I_{33}$ in FIG. 6), the circuit shown in FIG. 7 is employed and as the resistor $R_9$ in FIG. 4 or $R_{45}$ in FIG. 6, two resistors $R_C$ having the same resistance are used by connecting them in parallel. The resistance of the resistors $R_C$ and the resistance of all the load resistors $R_1$ to $R_8$ in FIG. 4 or $R_{41}$ to $R_{44}$ in FIG. 6 are selected to have the same value. By employing such parallel connection, an accurate ratio between the resistors can be achieved.

According to the present invention, signal amplitude within the integrated circuit can be reduced and power consumption is proportional to the signal amplitude; hence, an integrated circuit operable with a small power consumption is obtained, which is smaller than that of conventional integrated circuit by at least 9%.

Moreover, the signal amplitude can be reduced and hence a high-speed operation can be achieved. For example, a rise response time period tr responsive to a rise of the input signal is reduced to 350 pico second (PS) from 530 PS in the conventional circuit, while a fall response time period tf responsive to a fall of the input signal is also reduced to 350 PS from 470 PS in the conventional circuit per one gate.

As described above, according to the present invention, it is possible to realize a current mode logic IC which can be operated at low power consumption, at a high speed and in a stable manner despite various fluctuations.

Incidentally, an internal reference voltage generating circuit can be constructed to include the known constant voltage circuit and voltage dividing circuit.

Moreover, a plurality of reference potentials can be arbitrarily preset in accordance with logic unit requirements.

I claim:

1. An integrated circuit comprising:
   an input terminal for receiving an input logic signal having a first high level and a first low level;
   a reference voltage terminal for receiving an external reference voltage generated outside the integrated circuit, said reference voltage being intermediate in value between the levels of said input signal;
   a first stage current mode logic circuit including first and second input points for generating an internal logic signal having a second high level and a second low level, the voltage difference between said second logic levels being different from the voltage levels between said first levels;
   an internal stage current mode logic circuit including first and second input points;
   an internal reference voltage generator circuit for generating an internal reference voltage having a value intermediate between the levels of said internal logic signal;
   first means for connecting said reference voltage terminal to the second input point of said first stage current mode logic circuit;
   second means for supplying the first input point of said first stage current mode logic circuit with said input signal; third means for supplying the second input point of said internal stage current mode logic circuit with said internal reference voltage; and
   fourth means for supplying the first input point of said internal stage current mode logic circuit with said internal logic signal.

2. The circuit according to claim 1, in which said input signal has a larger amplitude than said internal signal.

3. The circuit according to claim 1, in which said input signal and said internal signal are binary logic signals, said reference voltage is substantially a center value between the levels of said input signal, and said internal reference voltage is substantially a center value between the levels of said internal logic signal.

4. The circuit according to claim 3, in which said first stage current mode logic circuit includes a first transistor having a base connected to the first input point of said first stage logic circuit, a second transistor having a base connected to the second input point of said first stage logic circuit, a first load element having a first terminal supplied with a first power voltage and second terminal connected to the collector of said first transistor, a second load element having a first terminal supplied with said first power voltage and a second terminal connected to the collector of said second transistor, and a constant current source having a first terminal connected to the emitters of said first and second transistors and a second terminal supplied with a second power voltage.

5. The circuit according to claim 4, in which said internal reference voltage generator includes means for dividing the voltage difference between said first and second power voltages to generate said internal reference voltage.

6. An integrated circuit comprising:
   a plurality of input terminals for receiving input logic signals, each of said input logic signals having first and second logic levels;
   a first power supply terminal for receiving a first voltage;
   a second power supply terminal for receiving a second voltage;
   a reference voltage terminal for receiving an external reference voltage generated outside the integrated circuit, said external reference voltage having an intermediate value between said first and second levels of said input logic signals;
   a plurality of first stage logic gates, each including an input point, a reference point and an output point for producing logic signals having third and fourth logic levels, the voltage difference between said third and fourth logic levels being different from the voltage difference between said first and second logic levels;
   a plurality of supply means for supplying the input points of said first stage logic gates with said input logic signals;
   means for connecting said reference voltage terminal to said reference points of said first stage logic gates;
   a plurality of second stage logic gates, each including an input point receiving the internal logic signal derived from said output point of at least one of said first stage logic gates, a reference point and an output point;
   an internal reference voltage generator for generating an internal reference voltage having an intermediate value between said third and fourth logic levels; and
   means for supplying the reference points of said second stage logic gates with said internal reference voltage.

7. The circuit according to claim 6, in which said input logic signals and said internal logic signal are binary logic signals, said external reference voltage being substantially a center value between said first and second levels, and said internal reference voltage being substantially a center value between said third and fourth levels.

8. The circuit according to claim 7, further comprising an output terminal and a third stage logic gate including at least one input point coupled to output point of one of said second stage logic gates and at least one output point coupled to said output terminal.

9. The circuit according to claim 7, in which said first stage logic gates and said second stage logic gates are current mode logic circuits.

10. The circuit according to claim 9, in which said internal reference voltage generator circuit includes a series circuit of resistor means and a constant current source coupled between said first and second power supply terminals.

11. The circuit according to claim 9, in which each of said first stage logic gates and said second stage logic gates includes a pair of load elements, a first transistor having a collector coupled to one of said pair of load elements, a base coupled to the input point and an emitter, a second transistor having a collector coupled to the other of said pair of load elements, a base coupled to the reference point and an emitter coupled to the emitter of said first transistor and a constant current source.

12. The circuit according to claim 7, in which the difference between said first and second levels is larger than the difference between said third and fourth levels.

13. An integrated circuit comprising a first voltage terminal, a second voltage terminal, first and second input terminals for receiving input signals, a reference voltage terminal for receiving a reference voltage, a first transistor having a base coupled to said first input terminal, a second transistor having a base coupled to said reference voltage terminal, a first constant current source coupled between said second voltage terminal and the emitters of said first and second transistors, a first load element coupled between said first voltage terminal and a collector of said first transistor, a second load element coupled between said first voltage terminal and a collector of said second transistor, a third transistor having a base coupled to said second input terminal and a collector coupled to said first voltage terminal, a first resistor coupled between an emitter of said third transistor and said second voltage terminal, a fourth transistor having a base coupled to said reference voltage terminal and a collector coupled to said first voltage terminal, a second resistor coupled between an emitter of said fourth transistor and said second voltage terminal, an internal reference voltage generator generating an internal reference voltage having an intermediate value of binary logic levels at the collector of said first transistor, a fifth transistor having a base coupled to the collector of said first transistor, a sixth transistor having a base supplied with said internal reference voltage, a third load element coupled between a collector of said fifth transistor and said first voltage terminal, a fourth load element coupled between a collector of said sixth transistor and said first voltage terminal, a seventh transistor having a collector coupled to the collector of said fifth transistor and a base coupled to the emitter of said third transistor, an eighth transistor having a collector commonly coupled to the emitters of said fifth and sixth transistors and a base coupled to the emitter of said fourth transistor, and a second constant current source coupled between emitters of said seventh and eighth transistors and said second voltage terminal.

14. An integrated circuit comprising first and second input terminals for receiving input signals, a reference voltage terminal for receiving a reference voltage having an intermediate value of binary logic levels of said input signals, a first current mode logic gate performing logic operation in response to the input signal at said first input terminal and said reference voltage, a first emitter-follower transistor receiving the input signal at said second input terminal, a second emitter-follower transistor receiving said reference voltage, a reference voltage generator for generating an internal reference voltage having a substantially intermediate value of binary logic levels of the output signal of said first logic gate, and a second current mode logic gate including first pair of emitter-coupled transistors performing switching operation in response to the output signals from said first and second emitter-follower transistors and a second pair of emitter-coupled transistors whose emitters are commonly coupled to one of collectors of said first pair emitter-coupled transistors, said second emitter-coupled transistors performing switching operation in response to the output signal of said first logic gate and said internal reference voltage.

* * * * *

UNITED STATES PATENT AND TRADEMARK OFFICE
CERTIFICATE OF CORRECTION

PATENT NO. : 4,359,653

DATED : November 16, 1982

INVENTOR(S) : Takamasa SUZUKI

It is certified that error appears in the above—identified patent and that said Letters Patent is hereby corrected as shown below:

Col. 1, line 36, after "case", insert --a--.

Col. 2, line 60, after "$Q_{11}$ and $Q_{12}$", insert --and--.

Col. 4, line 51, change "or" to --of--;

line 62, after "are", insert --set--.

Col. 6, line 11, change "signal" to --signals--.

Col. 7, line 2, after "with", insert --the--.

Signed and Sealed this

Nineteenth Day of April 1983

[SEAL]

Attest:

Attesting Officer

GERALD J. MOSSINGHOFF

Commissioner of Patents and Trademarks